US010305254B2

(12) United States Patent
Gazula et al.

(10) Patent No.: US 10,305,254 B2
(45) Date of Patent: May 28, 2019

(54) VCSEL WITH ELLIPTICAL APERTURE HAVING REDUCED RIN

(71) Applicant: Finisar Corporation, Sunnyvale, CA (US)

(72) Inventors: Deepa Gazula, Allen, TX (US); Nicolae Chitica, Kista (SE); Marek Chacinski, Farsta (SE); Gary Landry, Allen, TX (US); Jim Tatum, Plano, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 15/707,540

(22) Filed: Sep. 18, 2017

(65) Prior Publication Data

US 2019/0089127 A1     Mar. 21, 2019

(51) Int. Cl.
*H01S 5/183*     (2006.01)
*H01S 5/14*     (2006.01)
*H01S 5/022*     (2006.01)

(52) U.S. Cl.
CPC ...... *H01S 5/18325* (2013.01); *H01S 5/02248* (2013.01); *H01S 5/146* (2013.01); *H01S 5/18311* (2013.01); *H01S 5/18394* (2013.01)

(58) Field of Classification Search
CPC .. H01S 5/18325; H01S 5/02248; H01S 5/146; H01S 5/18311; H01S 5/18394
See application file for complete search history.

(56) References Cited

U.S. PATENT DOCUMENTS

| | | |
|---|---|---|
| 5,978,408 A | 11/1999 | Thornton |
| 6,208,681 B1 | 3/2001 | Thornton |
| 6,297,068 B1 | 10/2001 | Thornton |
| 6,304,588 B1 | 10/2001 | Chua et al. |
| 7,160,749 B2 | 1/2007 | Chua et al. |
| 7,433,381 B2 | 10/2008 | Wang et al. |
| 7,596,161 B2 | 9/2009 | Chua et al. |
| 8,774,246 B1 | 7/2014 | Deppe et al. |

(Continued)

OTHER PUBLICATIONS

Fiedler et al, High frequency behavior of oxidized single-mode single polarization VCSELs with elliptical current aperture, 1996, vol. 1, 211-212. (Year: 1996).*

(Continued)

*Primary Examiner* — Armando Rodriguez
(74) *Attorney, Agent, or Firm* — Maschoff Brennan

(57) ABSTRACT

A VCSEL can include: an elliptical oxide aperture in an oxidized region that is located between an active region and an emission surface, the elliptical aperture having a short radius and a long radius with a radius ratio (short radius)/(long radius) being between 0.6 and 0.8, the VCSEL having a relative intensity noise (RIN) of less than −140 dB/Hz. The VCSEL can include an elliptical emission aperture having the same dimensions of the elliptical oxide aperture. The VCSEL can include an elliptical contact having an elliptical contact aperture therein, the elliptical contact being around the elliptical emission aperture. The elliptical contact can be C-shaped. The VCSEL can include one or more trenches lateral of the oxidized region, the one or more trenches forming an elliptical shape, wherein the oxidized region has an elliptical shape. The one or more trenches can be trapezoidal shaped trenches.

19 Claims, 8 Drawing Sheets

(56) References Cited

U.S. PATENT DOCUMENTS

2007/0053399 A1    3/2007    Johnson et al.
2010/0303113 A1*  12/2010  Joseph .................... H01S 5/423
                                                                                           372/36

OTHER PUBLICATIONS

Yoshikawa, T et al., "Polarization-Controlled Single-Mode VCSEL", IEEE Journal of Quantum Electronics, vol. 34, No. 6, 1998.

Zhou, D., & Mawst, L. J. (2002). High-Power Single-Mode Antiresonant Reflecting Optical Waveguide-Type Vertical-Cavity Surface-Emitting Lasers. IEEE Journal of Quantum Electronics, 38(12), 1599-1606.

Zhao, G., & Deppe, D. (2011). Thermal performance of oxide-free lithographic VCSELs. IEEE, 915-916.

Chirovsky, L. M., Hobson, W. S., Leibenguth, R. E., Hui, S. P., Lopata, J., Zydzik, G. J., . . . D'Asaro, L. A. (1999). Implant-Apertured and Index-Guided Vertical-Cavity Surface-Emitting Lasers (I-VCSEL's). IEEE Photonics Technology Letters, 11(5), 500-502.

U Fiedler et al: "High frequency behavior of oxidized single-mode single polarization VCSELs with elliptical current aperture", Lasers and Electro-Optics Society Annual Meeting, 1996. LEOS 96., IEEE, vol. 1, Nov. 1996 (Nov. 1996), pp. 211-212, XP055538811, DOI: 10.1109/LEOS.1996.565202, ISBN: 978-0-7803-3160-0, (2 pages).

Rainer Michalzik et al: "High-Bit-Rate Data Transmission with Short-Wavelength Oxidized VCSEL's: Toward Bias Free Operation", IEEE Journal of Selected Topics in Quantum Electronics, vol. 3, Apr. 1997 (Apr. 1997), XP055538890, (9 pages).

Chua C L et al: "Antisotropic apertures for polarization-stable laterally oxidized vertical-cavity lasers", Applied Physics Letters, A I P Publishing LLC, US, vol. 73, No. 12, Sep. 21, 1998 (Sep. 21, 1998), pp. 1631-1633, XP012020971, ISSN: 0003-6951, DOI: 10.1063/1 .122228, (3 pages).

A. M. Kasten et al: "Fabrication and characterization of individually addressable vertical-cavity surface-emitting laser arrays and integrated VCSEL/PIN detector arrays", Proceedings of SPIE, vol. 6484, Feb. 6, 2007 (Feb. 6, 2007), p. 64840C, XP055539144, 1000 20th St. Bellingham WA 98225-6705 USA ISSN: 0277-786X, DOI: 10.LLI7 /L2.715086, ISBN: 978-1-5106-2099-5, , (6 pages).

D Wiedenmann et al: "Design and analysis of single-mode oxidized VCSELS for high-speed optical interconnects", IEEE Journal of Selected Topics in Quantum Electronics, 1999, pp. 503-511, XP055538856, DOI: 10.1109/2944.788412, (9 pages).

B Weigl et al: "High-performance oxide-confined GaAs VCSELs", IEEE Journal of Selected Topics in Quantum Electronics Apr. 1997 (Apr. 1997), pp. 409-415, XP055538841, DOI: 10.1109 /2944. 605686, (7 pages).

International Search Report and Written Opinion dated Feb. 19, 2019, in related PCT Application No. PCT/US2018/051585.

* cited by examiner

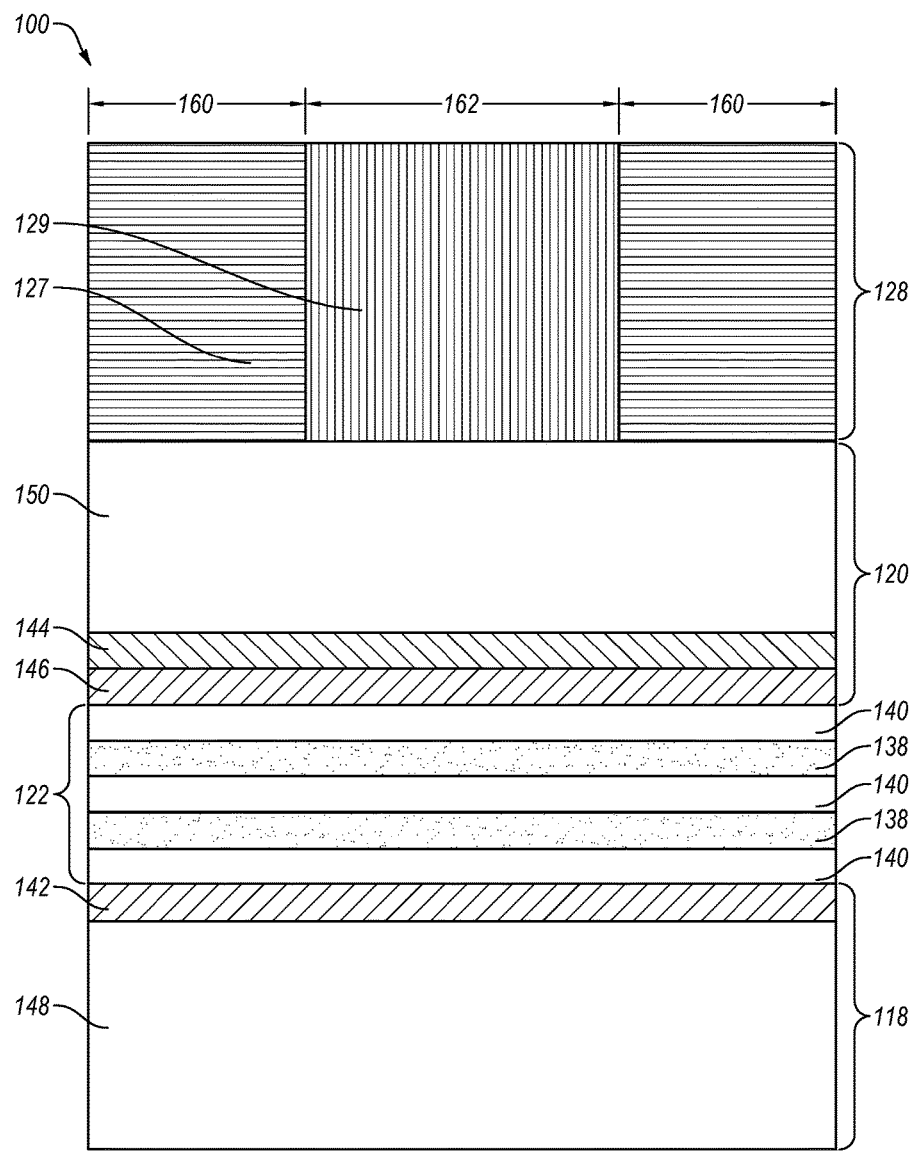
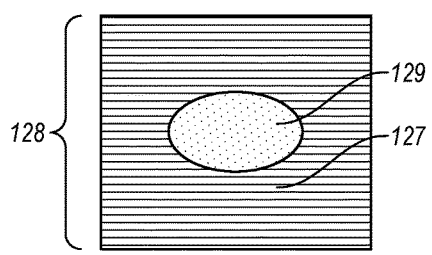
FIG. 2A
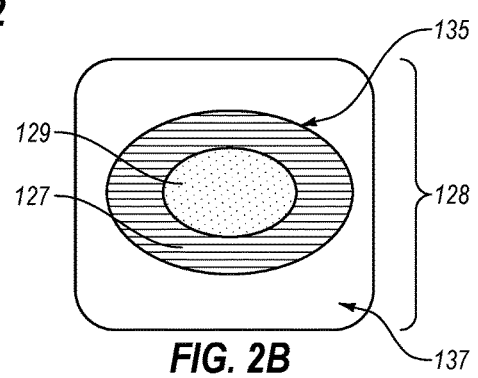
FIG. 2B
FIG. 2

VCSEL WITH ELLIPTICAL APERTURE HAVING REDUCED RIN

BACKGROUND

Lasers are commonly used in many modern communication components for data transmission. One use that has become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers output a high optical output representing binary highs and a lower power optical output representing binary lows. To obtain quick reaction time, the laser is constantly on, but varies from a high optical output to a lower optical output.

Optical networks have various advantages over other types of networks, such as copper wire based networks. For example, many existing copper wire networks operate at near maximum possible data transmission rates and at near maximum possible distances for copper wire technology. On the other hand, many existing optical networks exceed, both in data transmission rate and distance, the maximums that are possible for copper wire networks. That is, optical networks are able to reliably transmit data at higher rates over further distances than is possible with copper wire networks.

One type of laser that is used in optical data transmission is a Vertical Cavity Surface Emitting Laser (VCSEL). A VCSEL has a laser cavity that is sandwiched between and defined by two mirror stacks. A VCSEL is typically constructed on a semiconductor wafer such as Gallium Arsenide (GaAs). The VCSEL includes a bottom mirror constructed on the semiconductor wafer. Typically, the bottom mirror includes a number of alternating high and low index of refraction layers. As light passes from a layer of one index of refraction to another, a portion of the light is reflected. By using a sufficient number of alternating layers, a high percentage of light can be reflected by the mirror.

An active region that includes a number of quantum wells is formed on the bottom mirror. The active region forms a PN junction sandwiched between the bottom mirror and a top mirror, which are of opposite conductivity type (e.g. one p-type mirror and one n-type mirror). Notably, the notion of top and bottom mirrors can be somewhat arbitrary. In some configurations, light could be extracted from the wafer side of the VCSEL, with the "top" mirror totally reflective—and thus opaque. However, for purposes of this invention, the "top" mirror refers to the mirror from which light is to be extracted, regardless of how it is disposed in the physical structure. Carriers in the form of holes and electrons are injected into the quantum wells when the PN junction is forward biased by an electrical current. At a sufficiently high bias current, the injected minority carriers form a population inversion in the quantum wells that produces optical gain. Optical gain occurs when photons in the active region stimulate electrons to recombine with holes in the conduction band to the valance band, which produces additional photons. When the optical gain exceeds the total loss in the two mirrors, laser oscillation occurs.

The active region may also include an oxide aperture formed using one or more oxide layers formed in the top and/or bottom mirrors near the active region. The oxide aperture serves both to form an optical cavity and to direct the bias current through the central region of the cavity that is formed. Alternatively, other means, such as ion implantation, epitaxial regrowth after patterning, or other lithographic patterning may be used to perform these functions.

A top mirror is formed on the active region. The top mirror is similar to the bottom mirror in that it generally comprises a number of layers that alternate between a high index of refraction and a lower index of refraction. Generally, the top mirror has fewer mirror periods of alternating high index and low index of refraction layers, to enhance light emission from the top of the VCSEL.

Illustratively, the laser functions when a current is passed through the PN junction to inject carriers into the active region. Recombination of the injected carriers from the conduction band to the valence band in the quantum wells results in photons that begin to travel in the laser cavity defined by the mirrors. The mirrors reflect the photons back and forth. When the bias current is sufficient to produce a population inversion between the quantum well states at the wavelength supported by the cavity, optical gain is produced in the quantum wells. When the optical gain is equal to the cavity loss, laser oscillation occurs and the laser is said to be at threshold bias and the VCSEL begins to 'lase' as the optically coherent photons are emitted from the top of the VCSEL.

The subject matter claimed herein is not limited to embodiments that solve any disadvantages or that operate only in environments such as those described above. Rather, this background is only provided to illustrate one example technology where some embodiments described herein may be practiced.

SUMMARY

In one embodiment, a VCSEL can include: an elliptical oxide aperture in an oxidized region that is located between an active region and an emission surface, the elliptical aperture having a short radius and a long radius with a radius ratio (short radius)/(long radius) being between 0.6 and 0.8, the VCSEL having a relative intensity noise (RIN) of less than −140 dB/Hz. In one aspect, the VCSEL can include an elliptical emission aperture having the same dimensions of the elliptical oxide aperture. In one aspect, the VCSEL can include an elliptical contact having an elliptical contact aperture therein, the elliptical contact being around the elliptical emission aperture. In one aspect, the elliptical contact is C-shaped. In one aspect, the VCSEL can include one or more trenches lateral of the oxidized region, the one or more trenches forming an elliptical shape, wherein the oxidized region has an elliptical shape. In one aspect, the one or more trenches are trapezoidal shaped trenches. In one aspect, the VCSEL can include a mesa having the elliptical oxide aperture, oxidized region, elliptical emission aperture, elliptical contact, and one or more trenches in the elliptical shape. In one aspect, the VCSEL can include a contact pad and an electrical connector that electrically connects the contact pad with the elliptical contact.

In one embodiment, a plurality of VCSELs is provided. The plurality of the VCSELs can have a normal quantile of at least or about 0.9 (90%) of the VCSELs having at least a standard of acceptability. In one aspect, the plurality of VCSELs can include the normal quantile of at least about 0.9 (90%) having the RIN of less than or about −141 dB/Hz. In one aspect, each of the VCSELs of the normal quantile can be on a single wafer. In one aspect, each of the VCSELs of the normal quantile can have the elliptical aperture having a short radius and a long radius with a radius ratio (short radius)/(long radius) being between 0.64 and 0.7.

In one embodiment, a method of designing a VCSEL can include: preparing a plurality of VCSELs that each have an elliptical oxide aperture in an oxidized region that is located between an active region and an emission surface, an ellipticity of each VCSEL being defined by a short radius and a long radius of the elliptical oxide aperture with a radius ratio (short radius)/(long radius) being between 0.6 and 0.8, the plurality of VCSELs having a plurality of different radius ratios; operating the plurality of VCSELs to emit light; testing each VCSEL for its relative intensity noise (RIN); grouping each VCSEL into a group for a normal quantile of a standard of acceptability; and identifying at least one radius ratio for a normal quantile group of VCSELs having a RIN less than −140 dB/Hz. In one aspect, the preparing includes manufacturing the plurality of physical VCSELs. In one aspect, the preparing includes digitally creating the plurality of VCSELs to be simulated and the operating includes simulating emission of light from the plurality of VCSELs. In one aspect, the normal quantile group is at least or about 0.9 (90%). In one aspect, the method can include recording and storing the identified at least one radius ratio onto a non-transitory tangible medium. In one aspect, the method can include recording and storing the RIN and normal quantile for the identified at least one radius ratio into the non-transitory tangible medium so as to be linked with the identified at least one radius ratio.

In one embodiment, a method of manufacturing a VCSEL can include: obtaining a radius ratio for an elliptical oxide aperture for a VCSEL having a relative intensity noise (RIN) of less than −140 dB/Hz; identifying a short radius dimension and a large radius dimension for the radius ratio; preparing a VCSEL stack of layers; and oxidizing at least a portion of the VCSEL stack of layers to form the elliptical oxide aperture within a lateral oxidized region so as to have the radius ratio, short radius, and large radius. In one aspect, the method can include preparing and oxidizing a plurality of VCSELs to have the elliptical oxide aperture within a lateral oxidized region so as to have the radius ratio, short radius, and large radius, the plurality of VCSELs having a normal quantile of at least or about 0.9 (90%) having or above a standard of acceptability.

BRIEF DESCRIPTION OF THE FIGURES

The foregoing and following information as well as other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIG. 2 is a cross-sectional side view of an embodiment of a VCSEL having an elliptical oxide aperture.

FIGS. 2A-2B are each a top view of an embodiment of a VCSEL having an elliptical oxide aperture.

Figure 1:
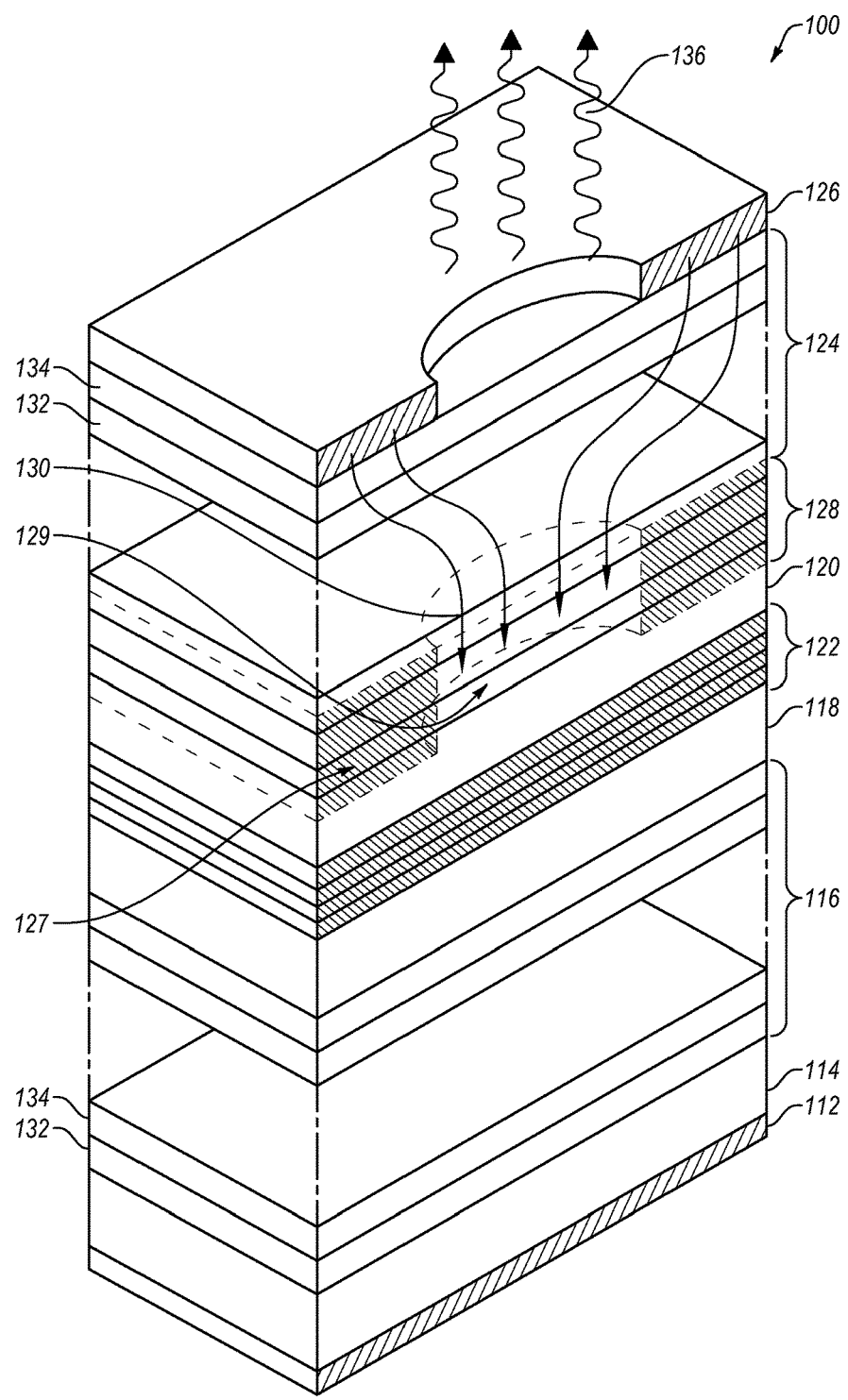
FIG. 1 is a schematic of an embodiment of a VCSEL operating environment having an elliptical oxide aperture.

The elements of the figures are arranged in accordance with at least one of the embodiments described herein, and which arrangement may be modified in accordance with the disclosure provided herein by one of ordinary skill in the art. The elements of each of the figures may be combined and arranged with the elements of the other figures.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Generally, the present advancement in VCSEL technology relates to an oxidized layer having an elliptical oxide aperture. That is, the oxidized layer has an aperture with an elliptical shape, and thereby is referred to an elliptical oxide aperture. The oxidized region and oxide aperture are commonly used in VCSELs. However, it has been found that making the oxidized aperture in an elliptical shape can provide surprising and unexpected results as described herein, such as improving the relative intensity noise (RIN). The oxidized region with the elliptical oxide aperture may be placed within a VCSEL as common in VCSELs, such as between the active region and top mirror. Accordingly, the oxidized layer around the elliptical aperture can provide a blocking region and the elliptical aperture can provide a conducting region.

The improved RIN can allow for the VCSELs described herein with the elliptical aperture to be used in high speed data links. High speed data links can be improved with lower signal to noise ratios. The VCSELs can include elliptical current confining apertures for oxide confined VCSELs to lower RIN and improve yield by reducing the across wafer variation of RIN. The elliptical aperture in the oxidized region introduces asymmetry into the current injection, and breaks up degeneracy in the modes. This stabilizes the mode structure. This in turn translates to lower variability of RIN in the VCSEL.

The elliptical aperture in the oxide region can be prepared by various methods. In one example, the lateral oxidation is used. In another example, the oxidized layer is formed and the elliptical aperture is formed by etching, and then refilling the elliptical aperture with a conductive material.

The elliptical aperture can include a material that is more electrically conducting than the oxidized material of the oxidized region in the oxidized layer during operation of the VCSEL and light emission in an active region. Accordingly, the oxidized region and elliptical aperture can form a heterojunction for selective current guidance. The elliptical aperture can form a conducting channel through the oxidized region. Planarized layers, such as mirror layers, can be formed over the oxidized layer having the elliptical aperture. Otherwise, the VCSEL can be prepared as standard in the industry or as in the incorporated references or described herein.

The semiconductor devices of the present invention can be manufactured from any type of semiconductor. Examples of suitable materials include III-V semiconductor materials (e.g., prepared from one or more Group III material (boron (B), aluminium (Al), gallium (Ga), indium (In), thallium (Tl), and ununtrium (Uut)) and one or more Group V materials (nitrogen (N), phosphorus (P), arsenic (As), antimony (Sb), bismuth (Bi) and ununpentium (Uup) (unconfirmed)) and optionally some type IV materials.

The semiconductor device can include an active region having one or more quantum wells and one or more quantum well barriers. The active region can be configured as any known or developed in the art of VCSELs.

Optionally, electrical confining layers can sandwich the active region and provide optical gain efficiency by confining carriers to the active region. The confining layers can have a region of high energy band gap which in many III-V compounds translates to high aluminum content (e.g., 70%-100% Al for the type III material). The aluminum content can be selected to give the material a relatively wide band gap, as compared to the band gap in the quantum well barriers of the active region. The wide band gap material can give the confining layer good carrier confinement and can increase the efficiency in the active region. In an exemplary embodiment, the high aluminum region may also include an increase in doping. The confining layer can be doped with a p-type or n-type dopant depending on whether the confinement barrier is on the n-side or p-side of the active region.

FIG. 1 shows a planar, current-guided, VCSEL 100 having an elliptical aperture 129 in an oxidized region 128. The VCSEL 100 can include periodic layer pairs for top (124) and bottom (116) mirrors. A substrate 114 is formed on a bottom contact 112 and is doped with a first type of impurities (i.e., p-type or n-type dopant). A bottom mirror stack 116 is formed on substrate 114 and an optional bottom confining layer 118 is formed on the bottom mirror stack 116. An active region 122 is formed over the bottom mirror stack 116, or over the bottom confining layer 118 (when present). An optional top confining layer 120 is formed over the active region 122. In one optional aspect, the bottom confining layer 118 and a top confining layer 120 sandwich the active region 122. An oxidized region 128 is formed over the active region 122 or over the optional top confining layer 120. The oxidation region includes a lateral oxidized region 127 and a central elliptical aperture 129. The bottom confining layer 118 and/or top confining layer 120 may be a spacer region between the active region and isolation region. Alternatively, the bottom confining layer 118 and/or top confining layer 120 may be a conducting region. Thus, any spacer region bounding the active region may be a confining region, conducting region, or semiconductor spacer that is not confining or conducting.

An upper mirror stack 124 is formed over the oxidized region 128. A metal layer 126 forms a contact on a portion of stack 124, and the metal layer 126 includes an optical aperture, which may be elliptical as shown, but may also be circular. However, other VCSEL configurations may also be utilized, and various other VCSEL layers or types of layers can be used; however, the resulting VCSEL includes an oxidized region having an elliptical aperture therethrough.

An oxidized region 128 restricts the area of the current flow 130 through the active region 122. Oxidized region 128 can be formed to include the lateral oxidized region 127 and the elliptical aperture 129 by any possible method.

Mirror stacks 116 (bottom) and 124 (top) can be distributed Bragg reflector (DBR) stacks, and include periodic layers (e.g., 132 and 134, but may be switched from what is shown). Periodic layers 132 and 134 are typically AlGaAs and AlAs, respectively, but can be made from other III-V semiconductor materials. Mirror stacks 116 and 124 can be doped or undoped and the doping can be n-type or p-type depending on the particular VCSEL design. However, other types of VCSEL mirrors may be used.

Metal contact layers 112 and 126 can be ohmic contacts that allow appropriate electrical biasing of VCSEL 100. When VCSEL 100 is forward biased with a voltage on contact 126 different than the one on contact 112, active region 122 emits light 136, which passes through top mirror stack 124 and out of the optical aperture 125. Those skilled in the art will recognize that other configurations of contacts can be used to generate a voltage across active region 122 and generate light 136.

In one embodiment, the oxidized region is formed by selective oxidation, such as lateral oxidation or top down oxidation. The lateral oxidation can be applied to an elliptically shaped mesa or VCSEL body shape by oxidizing the semiconductor regions to form the elliptical aperture. The top down oxidation can be performed after the semiconductor region to be oxidized is formed by applying an elliptical-shaped oxidation resistive covering and then oxidizing around the elliptical-shaped oxidation resistive covering to sufficiently oxidize the lateral oxidized region.

In one embodiment, any type of chemical vapor deposition can be used to deposit the semiconductor material to be oxidized, then the oxidation is performed. The elliptical aperture is then etched into the oxidized region. The elliptical aperture is then filled with the semiconductor material to form the conductive elliptical aperture and lateral oxidized region.

The oxidized region can include a single layer as an oxidized layer or multiple oxidized layers, and/or a single layer elliptical aperture or multiple layers of central conducting material in the elliptical aperture.

FIG. 2 illustrates the active region 122 and confining layers 118 and 120 under oxidized region 128 having the lateral oxidized region 127 and elliptical aperture 129. The lateral oxidized region 127 forms the outer current blocking regions 160, and the elliptical aperture 129 forms the central mode confinement region 162. Active region 122 is formed from one or more quantum wells 138 that are separated by quantum well barriers 140, where the optional transition layers may be the lines between the quantum wells 138 and barriers 140. The confining layers 118 and 120 may optionally include high aluminum content regions 142 and 144, respectively. The high aluminum content regions provide good carrier confinement in active region 122.

Confining region 120 can include a ramp region 146 that is positioned between active region 122 and high aluminum content region 144. As discussed below, the combination of high aluminum content region 144 and the ramp region 146 provide an injection structure with good carrier confinement and good electron injection.

Depending on the design of the VCSEL device and the thickness of high aluminum content regions 142 and 144, the confining regions 118 and 120 can optionally include spacer layers 148 and 150, respectively. The thickness of spacer layers 148 and 150 can be dependent upon the kind of VCSEL device being fabricated. In a vertical cavity resonant device such as a VCSEL, or VCSEL the spacer layers provide resonant spacing between mirrors and provide that the quantum wells of the active region are centered on a peak of the optical field if desired.

The confining layers 118 and 120 and active region 122 can be formed from one or more types of semiconductor materials, such as GaAs, AlAs, InP, AlGaAs, InGaAs, InAlAs, InGaP, AlGaAsP, AlGaInP, InGaAsP, InAlGaAs, SiGe, or the like. Prior to oxidation to form the oxidized region 128 may be these same semiconductor materials, which are then oxidized. As such, the material in the elliptical aperture 129 may also include these same semiconductor materials.

In one example, the lower electrical confining layer is AlInP. In another example, the upper electrical confining layer can be AlInGaP.

FIG. 2A shows a top view with a cross-section of an oxidized region 128 having the lateral oxidized region 127 and the elliptical aperture 129. This may be a portion of a chip having an array of VCSELs or a single VCSEL.

FIG. 2B shows a top view with a cross-section of an elliptical mesa 135 with shoulders 137. The elliptical mesa may include the oxidized region 128 having the lateral oxidized region 127 and the elliptical aperture 129

A single chip may have a plurality of VCSELs 100, each having an oxidized region 128 either planar as in FIG. 2A or etched to have a plurality of mesas as in FIG. 2B on a single chip.

In one embodiment, the semiconductor region that is oxidized may be initially grown or deposited as one or more layers, optionally containing some aluminum, and then oxidized to form the elliptical aperture. In an InP based system, the aluminum content of an acceptable material for one or more layers to be oxidized may be about 52 percent. In the GaAs based system such acceptable material for oxidation would have about 97 to 98 percent of aluminum content. The GaAs based layer(s) may be relatively easy to oxidize. The oxidation of such layers may be done laterally along the side of the device via a trench around the semiconductor layers and/or with a mesa receiving the lateral oxidation. The process of lateral oxidation may be eased by intentional oxygen incorporation. The oxygen, a water vapor, or other fluid containing oxygen may be used as an oxidizing or diffusing agent that is inserted into the oxidizing environment and/or layer(s) to oxidize. The term "fluid" may be a generic term which includes liquids and gases as species. For instance, water, air, and steam may be fluids.

In one embodiment, the placement of the oxidized region may be at the node. In one embodiment, a circular aperture of a VCSEL may be replaced with the elliptical aperture.

Figure 3A:
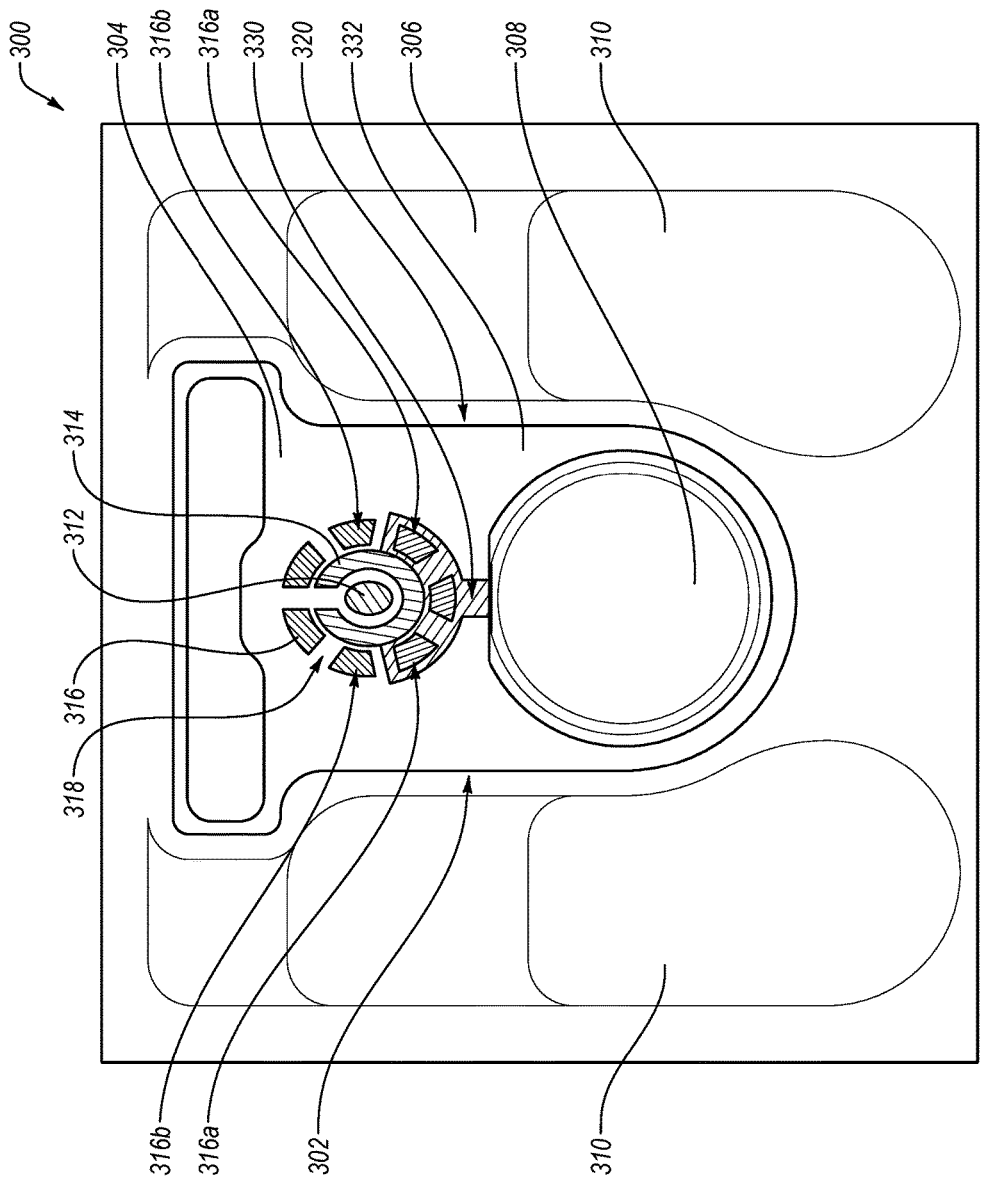
FIG. 3A is a top view of an embodiment of a VCSEL having an elliptical oxide aperture and with trapezoidal trenches in an elliptical shape.

FIG. 3A shows a top view of an embodiment of a wafer 300 that includes an elliptical VCSEL 302. The elliptical VCSEL 302 may be configured with layers as described herein so as to have the oxidized region with the lateral oxidized region with the elliptical aperture therein. The VCSEL 302 can include a mesa 304 protruding from the shoulder region 306. The mesa 304 includes the mesa contact 308 (e.g., anode pad), which can be a p-contact (or n-contact when the p/n is swapped). The shoulder 306 can include the shoulder pads 310 (e.g., cathode pads), which can be n-contact (or p-contact when the p/n is swapped). The mesa 304 includes the elliptical aperture 312. The elliptical aperture 312 is surrounded partially by an elliptical C-shaped contact 314. The elliptical aperture 312 and elliptical C-shaped contact 314 are concentrically surrounded by a plurality of trenches 316, which are shown to have a trapezoidal shape. The trenches 316 are used to define the elliptical aperture 312, and allow for the lateral oxidation to form the oxidation region, including the lateral oxidation region and the elliptical aperture 312. The trenches 316 are formed into the epitaxial semiconductor and allow the oxidizing fluid (e.g., steam) to perform the oxidation. As shown, the trenches 316 are in an elliptical arrangement around the elliptical aperture 312 and elliptical C-shaped contact 314 with gaps 318 between the trenches 316. Once the elliptical aperture 312 is formed, then the metal for the elliptical C-shaped contact 314 is formed. The mesa contact 308 is connected to the elliptical C-shaped contact 314 by a conductive connector 320.

In one embodiment, the mesa 304 can have a height from the shoulder region 306 within a range of 5-20 microns, 8-15 microns, or about 10-12 microns.

The trapezoidal trenches 316 may be partitioned into two types. The trapezoidal trenches 316 are closer to the mesa contact 308 and surrounded by the conductive connector 320 and may be filled with a dielectric material, covered with a conductive material (e.g., metal, conductive connector), and then covered with a dielectric material along with the rest of the mesa 304 and optionally shoulder region 306 too. These may be referred to as hybrid trenches 316*a*. The trenches 316 further from the mesa contact 308 may only be filled with dielectric material and coated with a dielectric material, and thereby are dielectric trenches 316*b*.

As shown, the VCSEL 302 includes the mesa 304 and the shoulder region 306 separated by mesa sides 330 that slope from the mesa top 332 to the shoulder region 306.

However, it should be recognized that the trenches 316 may be connected and be an elliptical trench. Also, the elliptical C-shaped contact 314 may be a fully ellipse shape. Other variations may be made.

While FIG. 3A shows the ellipticity of the elliptical aperture 312 to be oriented as shown, the ellipticity may be at any angle, such as 45 degrees, 90 degrees or other angle in 360 degrees.

Figure 3B:
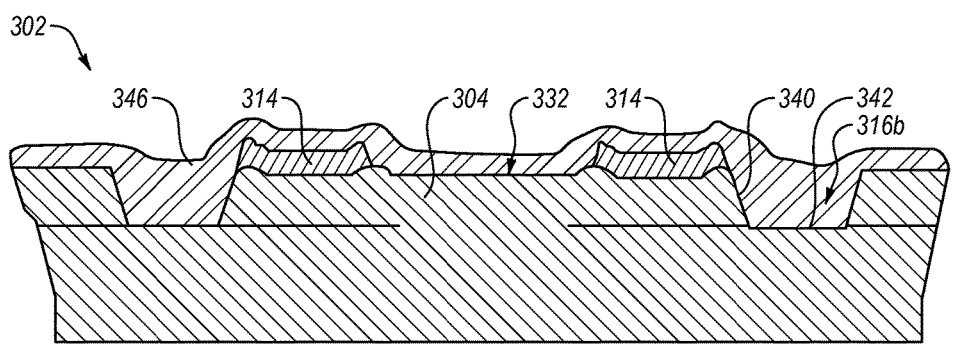
FIG. 3B is a cross-sectional side view of a VCSEL having an elliptical oxide aperture, with trapezoidal trenches in an elliptical shape, and with an elliptical contact.

FIG. 3B shows a cross-sectional side view of the mesa 304 of the VCSEL 302 of FIG. 3A. As shown, the mesa top 332 includes the C-shaped contact 314 thereon and lateral therefrom are the trenches 316*b* that includes the trench sides 340 sloped from the mesa top 332 to the trench bottom 342. As noted, the trenches 316*b* are those without the metal layer. As can be seen, the dielectric coating 346 covers the trenches 316*b*, C-shaped contact 314 and mesa top 332.

Figure 3C:
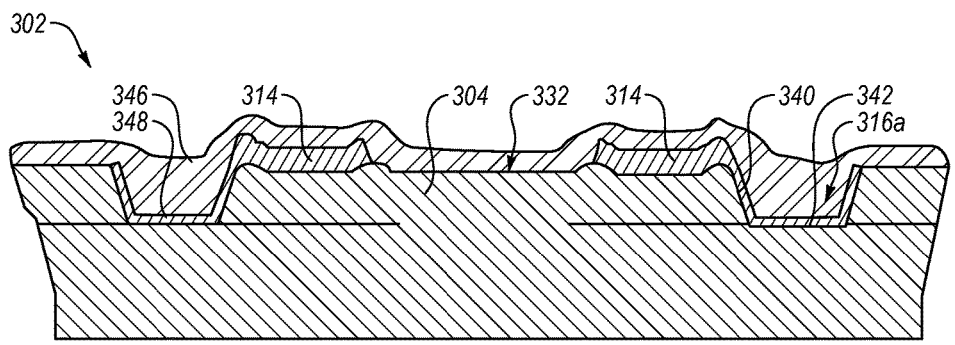
FIG. 3C is a cross-sectional side view of a VCSEL having an elliptical oxide aperture, with metallized trapezoidal trenches in an elliptical shape, and with an elliptical contact.

FIG. 3C shows another cross-sectional side view of the mesa 304 of the VCSEL 302 of FIG. 3A that bisects the hybrid trenches 316*a*. As shown, the mesa top 332 includes the C-shaped contact 314 thereon and lateral therefrom are the trenches 316*a* that includes the trench sides 340 sloped from the mesa top 332 to the trench bottom 342. The metal layer 348 of the C-shaped contact 314 is also on the trench sides 340 and trench bottom 340. The dielectric coating 346 covers the metal layer 348 in the trenches 316, C-shaped contact 314 and mesa top 332.

Figure 4:
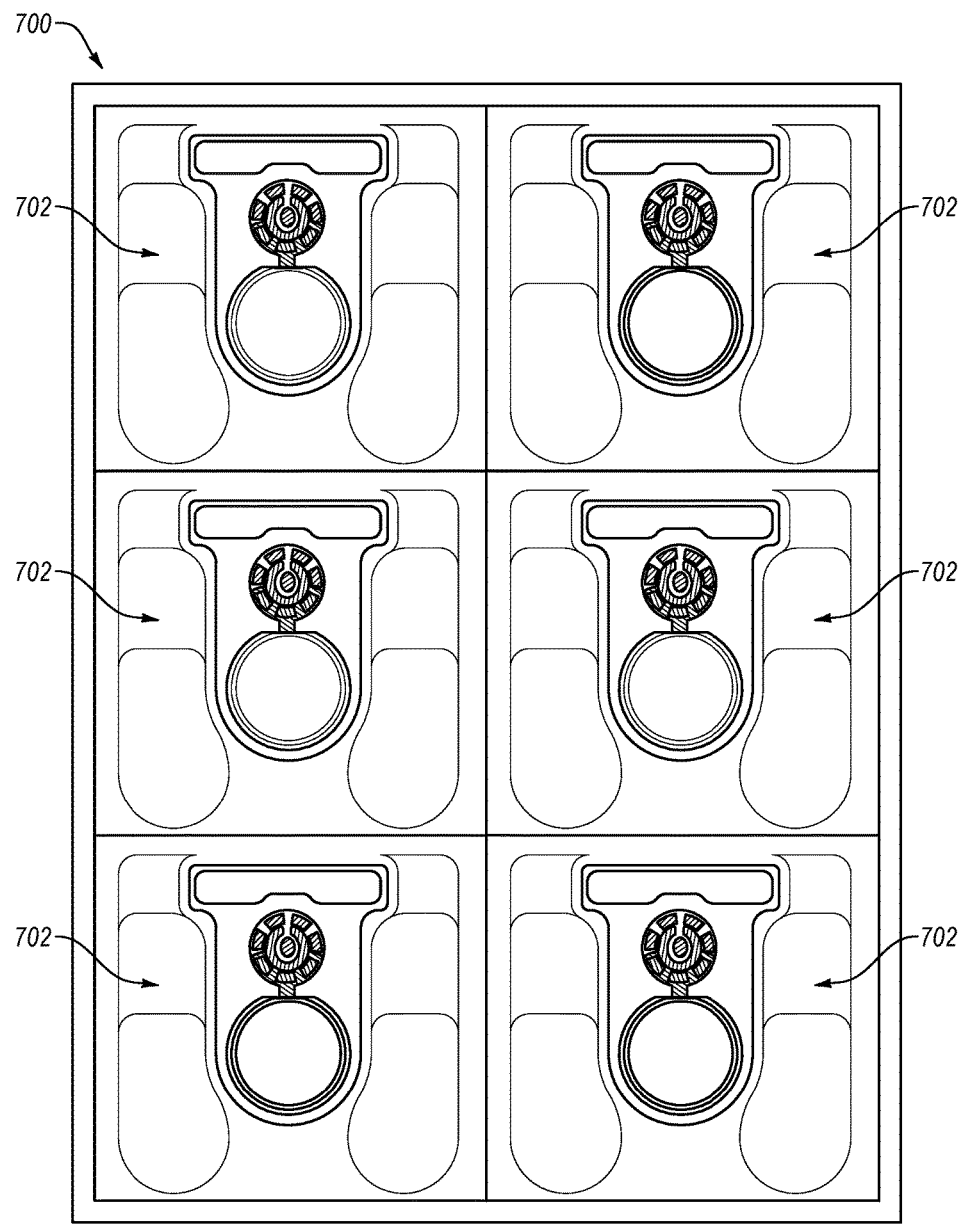
FIG. 4 is a top view of an embodiment of a wafer having an array of VCSELs with an elliptical oxide aperture.

In one embodiment, a single substrate or wafer can include a plurality of VCSEL emitters, which can be formed into an array. FIG. 4 shows such a laser array of VCSEL emitters 702 on a single substrate/wafer 700. It should be recognized that such a laser array can be arranged with any number of VCSEL emitters 702 along rows and/or columns, whether aligned or staggered or in any pattern.

Figure 5A:
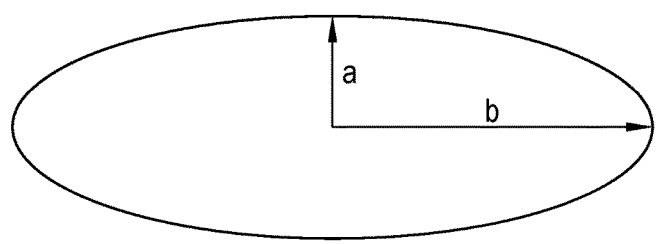
FIG. 5A is a schematic of a cross-sectional profile of an elliptical oxide aperture.

The VCSEL embodiments described herein having the elliptical aperture bound by the lateral oxidized region can provide benefits in reduced RIN. Accordingly, the RIN was studied for such VCSELs with different elliptical dimensions of the short radius "a" and long radius "b," as shown in FIG. 5A. Table 1 shows some values for the short radius (a), long radius (b), and the ellipticity (a/b).

TABLE 1

| Design | a (μm) | b (μm) | Area: π * a * b (μm$^2$) | Ellipticity (E): a/b |
|---|---|---|---|---|
| 1 | 3.5 | 3.5 | 38.48 | 1.00 |
| 2 | 3.1 | 3.95 | 38.47 | 0.78 |
| 3 | 2.8 | 4.37 | 38.44 | 0.64 |
| 4 | 2.5 | 4.9 | 38.48 | 0.51 |

Figure 5B:
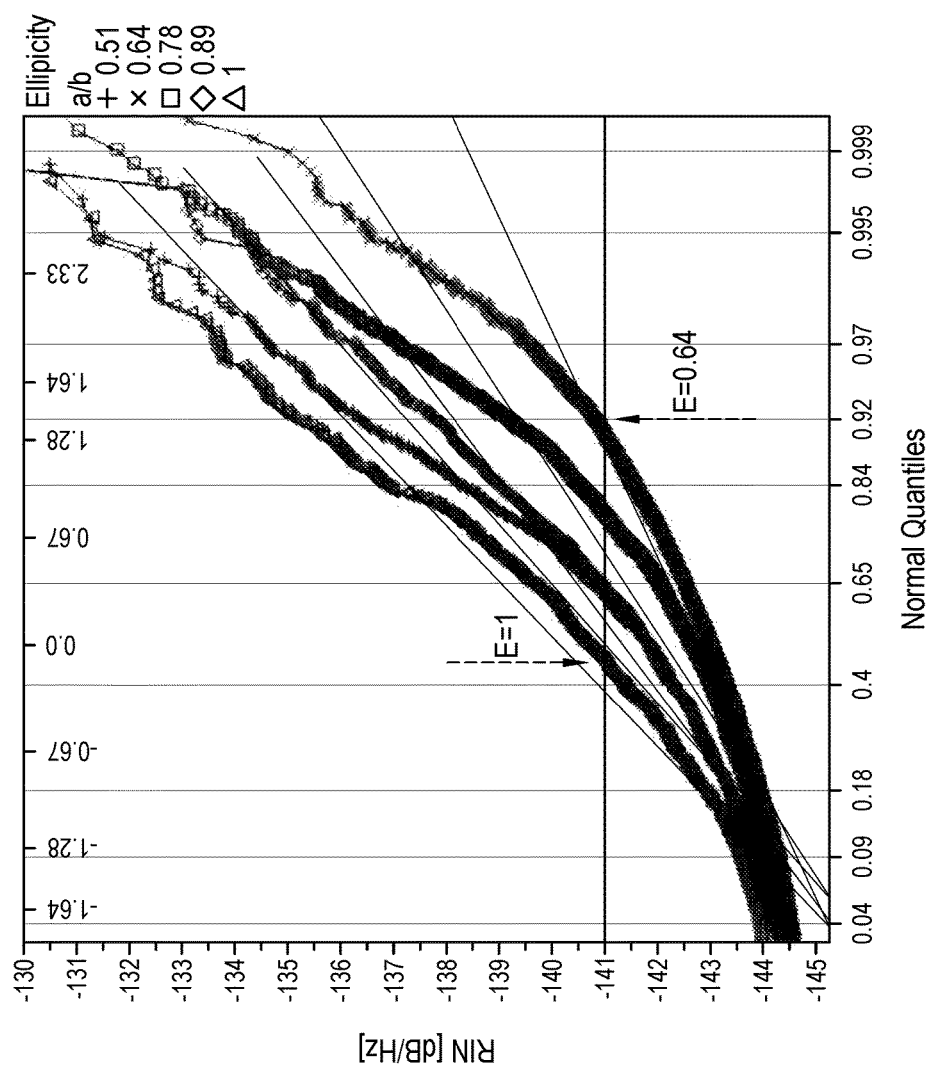
FIG. 5B includes a graph of the RIN versus normal quantiles for a number of different VCSELs having different ellipticities.

FIG. 5B shows a graph that includes a plot of normal quantile distribution of RIN for VCSELs with different ellipticities. For a RIN requirement of −141 dB/Hz (typical value for PAM4 VCSELs), only 46% percent of the population of circular VCSELs (e.g., a/b=E=1) meet the requirement or are better than the requirement. For elliptical VCSELs with a/b=E=0.64 almost 92% of the VCSELs have a RIN of −141 dB/Hz or lower. This is an increase in yield of 50%.

The data of FIG. 5B allows for enhanced design and manufacturing for VCSELs with elliptical apertures. In one aspect, the design can consider the desired normal quantile for a suitable distribution of acceptable VCSELs, and then identify the intersection between the normal quantile to the acceptable RIN (e.g., dB/Hz), and select the ellipticity E (e.g., a/b) that is closest to providing the selected normal quantile with the RIN. For example, 0.92 is a suitable quantile that is an improvement over prior VCSELs, which can be selected for −141 RIN, which then shows the ellipticity E of 0.64 being selected. In another example, the desired RIN may be selected and traced to a suitable normal quantile, and then the appropriate ellipticity E is selected. A wafer can then be processed to form a plurality of VCSELs therein that will have the selected ellipticity E with the selected RIN with the suitable normal quantile. In another example, the selection of RIN and normal quantiles can show that the range around E=0.64, such as 0.6 to 0.7 may be suitable, or 0.575 to 0.725 may be suitable, or 0.55 to 0.78 may be suitable. However, the value of ellipticity E closer to 0.64 may be optimal, such as +/−1%, 2%, 3%, 5%, or 10% thereof. It is believed that being able to select the desired RIN and normal quantile to determine the suitable ellipticity E is surprising and unexpected, and thereby the VCSELs with such an ellipticity have surprising and unexpected improvements in function with reduced RIN with increased normal quantiles across a wafer with a plurality of VCSELs or across a plurality of wafers having one or more VCSELs.

In one embodiment, when designing and manufacturing an array of VCSELs, the higher normal quantile is more desirable. As such, a higher normal quantile can be selected, and then the RIN for each ellipticity E can be evaluated to determine the ellipticity for a suitable RIN and the selected normal quantile. As such, normal quantile over or about 0.9, over or about 0.92, over or about 0.95, or over or about 0.98 may be desirable, with the normal quantile increasing for the number of VCSELs in the array. Accordingly, a plot, table, or other form of data of the RIN versus normal quantile for one or more ellipticities can be used in the determination of the parameters for the VCSELs, which can then be manufactured to obtain the array of VCSELs.

In one embodiment, a specific RIN, such as −141 or lower can be selected. Then, a number of different ellipticities can be prepared as test models or prototypes to determine the normal quantile. The preferred ellipticity E can then be selected for manufacturing.

Figure 5C:
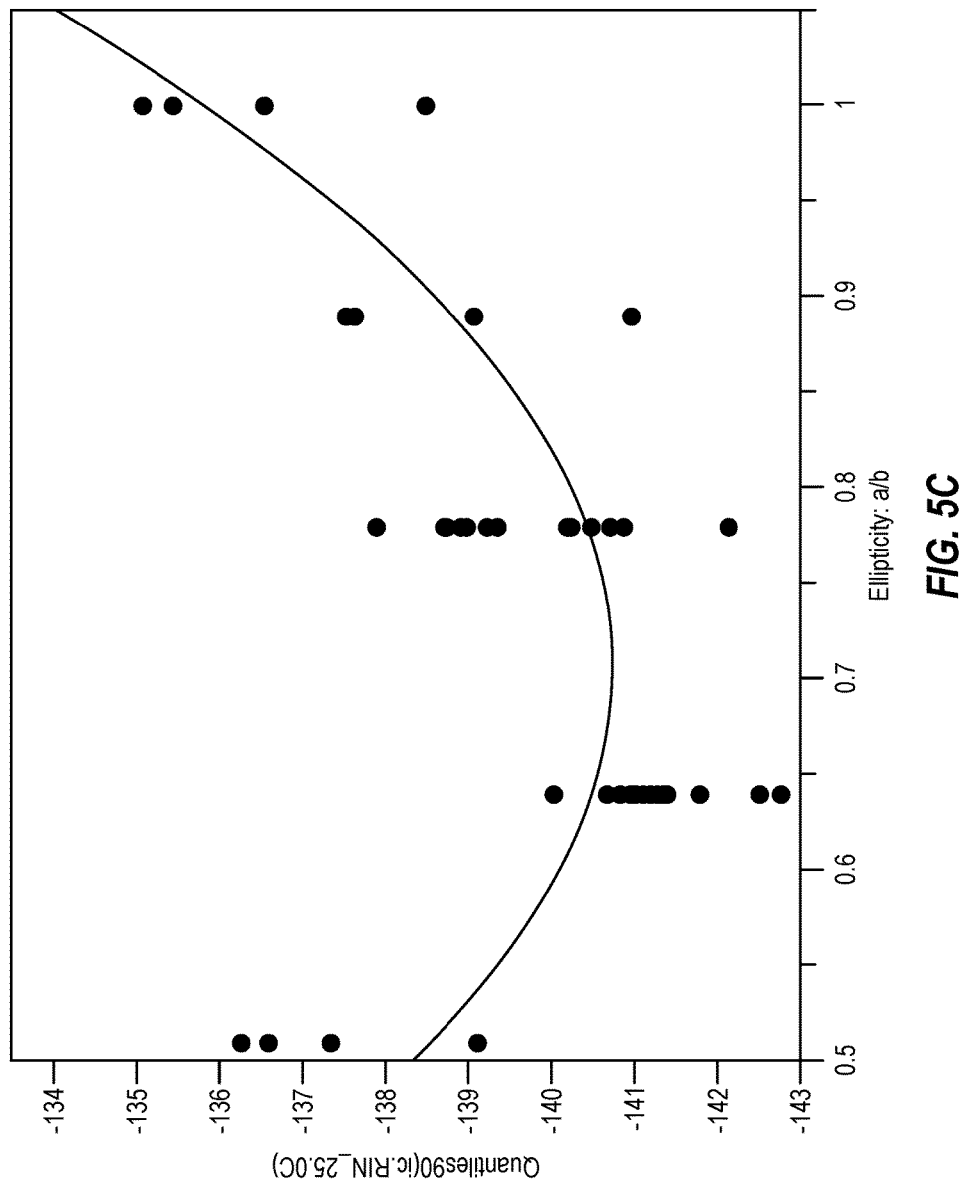
FIG. 5C includes a graph of the normal quantile 0.90 of RIN for different VCSELs versus the ellipticity.

FIG. 5C provides a graph of the fit of the value of the 90% quantile for RIN versus ellipticity E. As shown, the minimum of the curve may be the desired region for ellipticity E. As shown, the range from 0.6 to 0.78 is favorable, 0.64 to 0.74 is more favorable, and about 0.7 may be the most favorable. As such, any of these ranges, or E being 0.7+/−1%, 2%, 3%, 5%, or 10% thereof may be selected for the ellipticity.

In one embodiment, the short radius (a) may be about 2.8 microns +/−1%, 2%, 3%, 5%, or 10% thereof.

In one embodiment, the long radius (b) may be about 4.37 microns +/−1%, 2%, 3%, 5%, or 10% thereof.

In one embodiment, a method of selecting dimensions for an elliptical aperture can be performed. The RIN and normal quantile can be selected, and then the ellipticity is obtained from the data, such as the tables and graphs herein. The ellipticity is then set and the desired area can be selected from the data. The area and ellipticity then define the short radius (a) and the long radius (b). Once the design of the dimensions of the elliptical aperture are determined, the VCSEL is manufactured accordingly.

In one embodiment, a plurality of different sized areas for the elliptical aperture can be prepared based on the desired ellipticity, and a plurality of ellipticities can be prepared with each set having a plurality of areas. The data can be generated to compare the RIN and normal quantile in order to provide the tables or graphs for selecting the value for the ellipticity, short radius a and long radius b, which is used to then prepare the VCSEL or array of VCSELs.

Figure 6A:
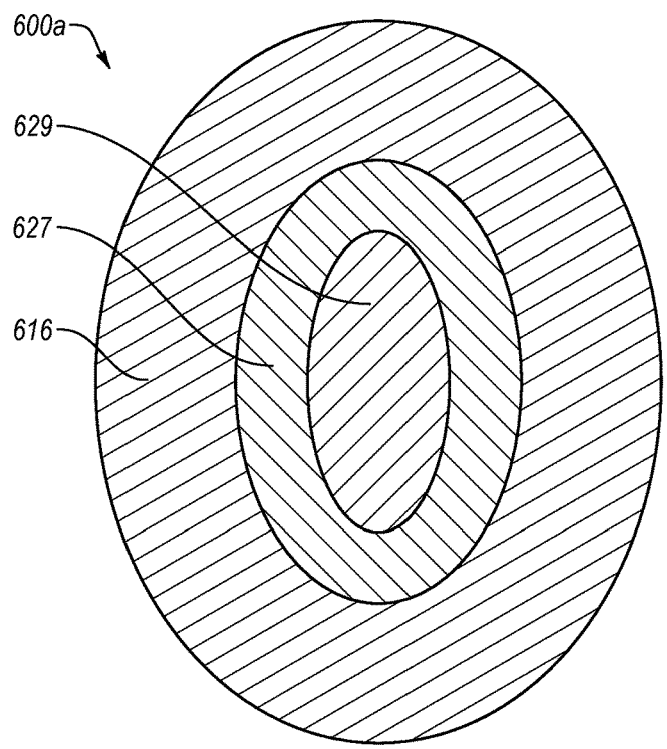
FIG. 6A is a top view of an embodiment of an elliptical VCSEL.

FIG. 6A shows an elliptical VCSEL 600a having the elliptical oxide aperture 629 bounded by an elliptical lateral oxidized region 627. The elliptical lateral oxidized region 627 is bound by an elliptical trench 616. However, while the elliptical trench 616 is shown as a continuous trench it may be divided into one or more distinct trenches with gaps between each trench, where optionally, each trench may or may not be trapezoidal as shown in FIG. 3A. Here, the elliptical VCSEL 600a may be in a chip with or without a mesa, where any mesa may be elliptical or a macro mesa such as shown in FIG. 3.

Figure 6B:
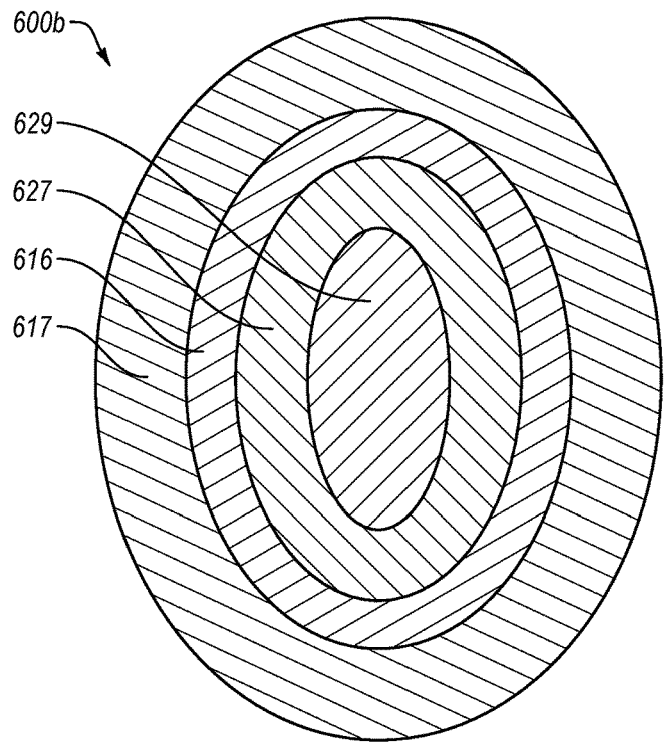
FIG. 6B is a top view of an embodiment of an elliptical VCSEL with an elliptical mesa.

FIG. 6B shows an elliptical VCSEL 600b having the elliptical oxide aperture 629 bounded by an elliptical lateral oxidized region 627. The elliptical lateral oxidized region 627 is bound by an elliptical trench 616. However, while the elliptical trench 616 is shown as a continuous trench it may be divided into one or more distinct trenches with gaps between each trench, where optionally, each trench may or may not be trapezoidal as shown in FIG. 3A. Here, the elliptical VCSEL 600b is in an elliptical mesa 617. The elliptical mesa 617 may also include the elliptical contact, and the contact pad may be on a shoulder (e.g., with the other contact pads) with an electrical connector therebetween such as on a mesa side surface.

In one embodiment, a VCSEL can include an elliptical aperture in an oxidized region that is located between an active region and an emission surface, the elliptical aperture having a short radius and a long radius with a radius ratio (short radius)/(long radius) being less than 1. In one aspect, the elliptical aperture has a radius ratio of between 0.6 and 0.8, between 0.64 and 0.75, between 0.68 and 0.72, between about 0.62 and 0.66, or about 0.64 or about 0.70. In one aspect, the VCSEL includes an elliptical emission aperture at or proximal to the emission surface. In one aspect, the elliptical emission aperture has a short radius and a long radius which is the same as the elliptical aperture in the oxidized region (e.g., elliptical oxide aperture). In one aspect, the VCSEL includes at least a portion of a mirror stack between the elliptical aperture and the emission surface. In one aspect, the VCSEL includes at least a portion of a mirror stack between the oxidized region and the emission surface.

In one embodiment, the oxidized region includes a lateral oxidized region that is lateral of the elliptical oxide aperture. In one aspect, the lateral oxidized region can have a height that is the same as the height of the elliptical oxide aperture. In one aspect, the lateral oxidized region can be elliptical, having the elliptical oxide aperture defined by an elliptical lateral oxidized region.

In one embodiment, the VCSEL includes an elliptical contact having an elliptical contact aperture, the elliptical contact aperture being aligned with the elliptical oxide aperture, and optionally aligned with the elliptical emission aperture. In one aspect, the elliptical oxide aperture has a short radius and a long radius that is the same as the elliptical oxide aperture, and optionally aligned with the elliptical emission aperture. In one aspect, the elliptical contact bounds and/or defines the area of the elliptical emission aperture, or is +/−1%, 2%, 5%, 10%, or 25% thereof. In one aspect, the elliptical contact is C-shaped. In one aspect, the gap in the C-shaped elliptical contact is oriented toward a contact pad, or alternatively is oriented away from the contact pad or at any angle relative thereto. In one aspect, an electrical connector connects the elliptical contact to the contact pad.

In one embodiment, the VCSEL includes one or more trenches located around the oxidized region. In one aspect, the one or more trenches form one or more trenches in an elliptical shape. In one aspect, the one or more trenches are elliptical trenches. In one aspect, two or more trenches are arranged in an elliptical shape. In one aspect, the one or more trenches includes a plurality of trenches one adjacent to the next in an elliptical circumferential arrangement. In one aspect, each trench is lateral of the oxidized region.

In one embodiment, the VCSEL includes a mesa having the elliptical aperture and oxidized region. In one aspect, the active region is in the mesa, or it is in a base region under the mesa. In one aspect, the lateral oxidized region is bound by the mesa side surface, which may be vertical or sloped. In one aspect, the mesa includes the elliptical contact on the top mesa surface. In one aspect, the mesa includes the one or more trenches around the oxidized region. In one aspect, the mesa includes a contact pad that is electrically coupled through an electrical connector to the elliptical contact. In one aspect, the mesa is a macro mesa with a cross-sectional profile substantially larger than the oxidized region, or than the one or more trenches.

In one embodiment, a plurality of the VCSELs having the elliptical aperture can have a defined standard for acceptability, wherein VCSELs below the standard of acceptability are defined as unacceptable and VCSELs at or above the standard of acceptability are defined as acceptable. In one aspect, the plurality of VCSELs are in a manufacturing lot, wherein the manufacturing lot may be a single production run, a single wafer, a single chip, a single group of single wafers, a single group of single chips, or the like. In one aspect, the standard of acceptability is at least the 0.65 normal quantile, at least the 0.75 normal quantile, at least the 0.80 normal quantile, at least the 0.85 normal quantile, at least the 0.90 normal quantile, at least the 0.92 normal quantile, at least the 0.95 quantile, at least the 0.98 quantile, or at least the 0.99 quantile.

In one embodiment, a wafer or chip includes a plurality of the VCSELs having the elliptical aperture and oxidized region. The VCSELs can be arranged in an array. The array of VCSELs may be arranged in aligned rows. The array of VCSELs may be arranged in staggered rows and columns. In one aspect, the wafer or chip is obtained from single production run and thereby considered to be at least one wafer or chip of a manufacturing lot. The wafer or chip may have the standard of acceptability for all of the VCSELs thereon of at least the 0.65 normal quantile, at least the 0.75 normal quantile, at least the 0.80 normal quantile, at least the 0.85 normal quantile, at least the 0.90 normal quantile, at least the 0.92 normal quantile, at least the 0.95 quantile, at least the 0.98 quantile, or at least the 0.99 quantile. Each VCSEL on the wafer or chip may have the same dimensioned elliptical oxide aperture. Each VCSEL on the wafer or chip may have the same dimensions: elliptical contact, oxidized lateral region, trenches, one or more contact pads, mesa, electrical connector, and/or other feature.

In one embodiment, a method of designing a VCSEL having an elliptical aperture in an oxidized region can be provided. The method can include performing a case study of a plurality of VCSELs having different elliptical aperture cross-sectional profiles, wherein the elliptical aperture can be the elliptical oxide aperture and/or the elliptical emission aperture, and wherein the elliptical aperture can be varied in short radius dimension (a) and/or long radius dimension (b) and/or radius ratio (a/b) also known as ellipticity (E). Each VCSEL of the case study may be a simulated VCSEL that is simulated for the case study or a physical VCSEL that is manufactured for the case study. Each VCSEL of the case study is assessed for RIN. Each VCSEL of the case study is assessed for a standard of acceptability. The standard of acceptability being assessed can include the RIN, short radius, long radius, elliptical cross-sectional area, light emission intensity, light emission power, data speed, modulation rate, signal to noise ratio, or other. The RIN may be compared to the normal quantile for the VCSELs in the case study. The RIN for a defined normal quantile (e.g., 0.9) can be compared to the ellipticity (E). The ellipticity E may be selected for a defined RIN (e.g., −141) and a defined normal quantile (e.g., 0.9). The short radius dimension and long radius dimension may be defined for the ellipticity E. One or more VCSELs, such as an array of VCSELs or wafer/chip with VCSELs, can be manufactured with the selected ellipticity having the short radius dimension and long radius dimension to have the defined RIN, such that the plurality of VCSELs fall within the defined normal quantile for the standard of acceptability.

In one embodiment, a method of manufacturing is provided. The method of manufacturing may include obtaining specifications for the VCSEL, which specifications include the ellipticity E, short radius dimension (a), and long radius dimension (b) for the elliptical aperture. The VCSEL is manufactured by preparing a plurality of semiconductor layers that define the features of the VCSEL, such as shown in the figures and/or described herein. The VCSEL can be manufactured to provide the bottom mirror, active region, and top mirror with or without any of the other features. A lower portion of the top mirror adjacent to the active region may be oxidized to form the elliptical oxide aperture defined by the lateral oxidized region. In one embodiment, the VCSEL layers are formed and then one or more trenches in an elliptical shape are formed by etching. The etching can be performed as standard in the art with etch resistive templates being applied to the top of the VCSEL, such that etching is performed around the etch resistive templates. The etch resistive templates may define the one or more trenches, and optionally, the mesa. The etching may be performed with the etch resistive templates in place, and once etching is complete the etch resistive templates may be removed or additional layers may be deposited thereon. The etched VCSEL layers may then be subjected to selective oxidation in order to form the oxide region having the elliptical oxide aperture. In one aspect, an oxidation resistive layer may be applied to the top of the VCSEL layers. In one aspect, an oxidation resistive layer/coating may be applied into the side walls of the one or more trenches so as to define an oxidation region that does not have any oxidation resistive layer. The oxidation is performed until the desired elliptical oxide aperture is formed within the oxidized region. The oxidation resistive layer may be removed or it may be included in the VCSEL. Optionally, one or more layers, such as the top mirror may be formed after the oxidation so as to be located above the oxidized region. The elliptical contact can then be formed around an elliptical emission aperture, and where one or more of the contact pads may be formed. The metal of the elliptical contact may be connected to the contact pad with or without also covering one or more trenches (e.g., trapezoidal trenches) or a portion of an elliptical trench. A dielectric covering can then be applied to the top region of the VCSEL, and may cover the one or more trenches (e.g., fill the trenches), cover at least a portion of the elliptical contact, cover at least a portion of a top surface of the VCSEL layers, and either cover or form an emission surface over the elliptical aperture.

In one embodiment, the method of manufacture can include forming the VCSEL layers to include an oxidizable layer (e.g., one or more discrete layers, such as deposition layers). Then, etching the elliptical aperture into the oxidizable layer and then filling the elliptical aperture with a non-oxidizable material (e.g., devoid of aluminum). Optionally, one or more trenches are etched, either along with etching the elliptical aperture or after the elliptical aperture is filled with the non-oxidizable material. The oxidizable layer is then oxidized to form the lateral oxidized region. The top layers, such as top mirror, may be formed before or after the oxidizing. Prior to oxidizing, a non-oxidizable layer/coating can be applied as an oxidation resistive template.

It will be appreciated that other methods of manufacturing can be performed to form the embodiments of the VCSEL having the elliptical oxide aperture that is described herein.

Common to chemical etching, a mask can be used to define the etching part and non-etching part. A mask or other chemical blocking material can be placed on the blocking layer with apertures defining where the chemical etch will occur. In one example, MOCVD deposition is used to form the VCSEL layers. In one example, the non-etching region is defined by placing a layer of $SiO_2$ everywhere on the blocking layer except for leaving the one or more holes (circular, trapezoidal or other shape) for the region to be etched (e.g., trenches). Then the $SiO_2$ is removed.

Also, the active region or whole semiconductor layers of a VCSEL can be produced with molecular beam epitaxy (MBE). Lower growth temperatures during the MBE can be used to prepare the VCSEL semiconductor layers. The growth of these structures by MBE can be performed at <(less than) 500° C. Comparatively, the temperatures for MOCVD can be >(greater than) 600° C. Additionally, the VCSELs can be prepared by methods that are similar to MBE, such as GSMBE (gas source MBE) and MOMBE (metalorganic MBE) or the like that can produce the regions as described.

The chemical etching can be any that is useful and known in the art.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims. All references recited herein are incorporated herein by specific reference in their entirety.

1. Polarization-Controlled Single-Mode VCSEL, T. Yoshikawa, et al, IEEE Journal Of Quantum Electronics, Vol. 34, No. 6, 1998.

The invention claimed is:

1. A VCSEL comprising:
   an elliptical oxide aperture in an oxidized region that is located between an active region and an emission surface, the elliptical aperture having a short radius and a long radius with a radius ratio (short radius)/(long radius) being from about 0.6 to about 0.8, the VCSEL having a relative intensity noise (MN) of less than or about −140 dB/Hz; and
   one or more trenches lateral of the oxidized region, the one or more trenches forming an elliptical shape, wherein the oxidized region has an elliptical shape.

2. The VCSEL of claim 1, further comprising an elliptical emission aperture having same dimensions of the elliptical oxide aperture.

3. The VCSEL of claim 2, further comprising an elliptical contact having an elliptical contact aperture therein, the elliptical contact being around the elliptical emission aperture.

4. The VCSEL of claim 3, wherein the elliptical contact is C-shaped.

5. The VCSEL of claim 1 wherein the one or more trenches are trapezoidal shaped trenches.

6. The VCSEL of claim 5, further comprising a mesa having the elliptical oxide aperture, oxidized region, elliptical emission aperture, elliptical contact, and one or more trenches in the elliptical shape.

7. The VCSEL of claim 6, further comprising a contact pad and an electrical connector that electrically connects the contact pad with the elliptical contact.

8. A plurality of VCSELs, each VCSEL being the VCSEL of claim 1, the plurality of VCSELs being a group of VCSELs with a normal quantile of at least or about 0.9 (90%) having at least a standard of acceptability.

9. The plurality of VCSELs of claim 8, wherein the plurality of VCSELs being a group of VCSELs with the normal quantile of at least about 0.9 (90%) have the RIN of less than or about −141 dB/Hz.

10. The plurality of VCSELs of claim 9, each VCSEL being on a single wafer.

11. The plurality of VCSELs of claim 10, each VCSEL having the elliptical aperture having a short radius and a long radius with a radius ratio (short radius)/(long radius) being from about 0.64 to about 0.7.

12. A method of designing a VCSEL, the method comprising:
   preparing a plurality of VCSELs that each have an elliptical oxide aperture in an oxidized region that is located between an active region and an emission surface, an ellipticity of each VCSEL being defined by a short radius and a long radius of the elliptical oxide aperture with a radius ratio (short radius)/(long radius) being from about 0.6 to about 0.8, the plurality of VCSELs having a plurality of different radius ratios;
   operating the plurality of VCSELs to emit light;
   testing each VCSEL for its relative intensity noise (RIN);
   grouping each VCSEL into a group for a normal quantile of a standard of acceptability; and
   identifying at least one radius ratio for a normal quantile group of VCSELs having a RIN less than or about −140 dB/Hz.

13. The method of claim 12, wherein the preparing includes manufacturing the plurality of physical VCSELs.

14. The method of claim 12, wherein the preparing includes digitally creating the plurality of VCSELs to be simulated and the operating includes simulating emission of light from the plurality of VCSELs.

15. The method of claim 12, wherein the normal quantile group is at least or about 0.9 (90%).

16. The method of claim 12, comprising recording and storing the identified at least one radius ratio onto a non-transitory tangible medium.

17. The method of claim 16, comprising recording and storing the RIN and normal quantile for the identified at least one radius ratio into the non-transitory tangible medium so as to be linked with the identified at least one radius ratio.

18. A method of manufacturing a VCSEL, the method comprising:
   obtaining a radius ratio for an elliptical oxide aperture for a VCSEL having a relative intensity noise (RIN) of less than or about −140 dB/Hz;

identifying a short radius dimension and a large radius dimension for the radius ratio;

preparing a VCSEL stack of layers;

oxidizing at least a portion of the VCSEL stack of layers to form the elliptical oxide aperture within a lateral oxidized region so as to have the radius ratio, short radius, and large radius; and forming one or more trenches lateral of the oxidized region, the one or more trenches forming an elliptical shape, wherein the oxidized region has an elliptical shape.

19. The method of claim 18, comprising:

preparing and oxidizing a plurality of VCSELs to have the elliptical oxide aperture within a lateral oxidized region so as to have the radius ratio, short radius, and large radius, the plurality of VCSELs being a group of VCSELs having a normal quantile of at least or about 0.9 (90%) having or at least a standard of acceptability.

* * * * *